(12) United States Patent
Ludikhuize et al.

(10) Patent No.: US 7,459,750 B2
(45) Date of Patent: Dec. 2, 2008

(54) INTEGRATED HALF-BRIDGE POWER CIRCUIT

(75) Inventors: Adrianus Willem Ludikhuize, Eindhoven (NL); Jacob Antonius Van Der Pol, Nijmegen (NL); Raymond J. Grover, Didsbury (GB)

(73) Assignee: NXP B.V., Eindhoven (NL)

( * ) Notice: Subject to any disclaimer, the term of this patent is extended or adjusted under 35 U.S.C. 154(b) by 379 days.

(21) Appl. No.: 10/537,575

(22) PCT Filed: Dec. 8, 2003

(86) PCT No.: PCT/IB03/05806

§ 371 (c)(1),
(2), (4) Date: Jun. 6, 2005

(87) PCT Pub. No.: WO2004/054078

PCT Pub. Date: Jun. 24, 2004

(65) Prior Publication Data

US 2006/0054967 A1    Mar. 16, 2006

Related U.S. Application Data

(60) Provisional application No. 60/432,302, filed on Dec. 10, 2002.

(51) Int. Cl.
*H01L 29/76* (2006.01)
*H01L 29/94* (2006.01)
*H01L 31/062* (2006.01)
*H01L 31/113* (2006.01)

(52) U.S. Cl. ............... 257/334; 257/329; 257/337; 257/343

(58) Field of Classification Search ............... 257/343, 257/329, 330, 334, 335, 337
See application file for complete search history.

(56) References Cited

U.S. PATENT DOCUMENTS

| | | | | |
|---|---|---|---|---|
| 4,910,563 | A | * | 3/1990 | Tuska et al. ............... 257/329 |
| 4,949,142 | A | * | 8/1990 | Contiero et al. ............ 257/329 |
| 5,129,911 | A | * | 7/1992 | Siczek et al. ............... 600/429 |
| 5,449,936 | A | * | 9/1995 | Paparo et al. ............... 257/337 |
| 5,451,896 | A | | 9/1995 | Mori |
| 5,528,480 | A | | 6/1996 | Kikinis |
| 5,610,503 | A | | 3/1997 | Fogg |
| 5,818,282 | A | * | 10/1998 | Sumida ...................... 327/424 |
| 6,288,424 | B1 | | 9/2001 | Ludikhuize |
| 6,346,726 | B1 | | 2/2002 | Herman |
| 2001/0003367 | A1 | * | 6/2001 | Hshieh et al. ............... 257/330 |
| 2001/0008788 | A1 | * | 7/2001 | Hshieh et al. ............... 438/270 |
| 2003/0062622 | A1 | * | 4/2003 | Pavier et al. ............... 257/734 |
| 2005/0122754 | A1 | * | 6/2005 | Nielsen ...................... 363/132 |

* cited by examiner

*Primary Examiner*—Shouxiang Hu
(74) *Attorney, Agent, or Firm*—Peter Zawilski

(57) ABSTRACT

A down converter includes an integrated circuit, which includes a control FET (CF) and a synchronous rectifier FET (SF). The control FET is a lateral double-diffused (LDMOS) FET, and the conductivity-type of the LDMOS FET and the conductivity-type of the substrate are of the same type.

12 Claims, 6 Drawing Sheets

INTEGRATED HALF-BRIDGE POWER CIRCUIT

CROSS REFERENCE TO RELATED APPLICATION

This application claims the benefit of U.S. provisional application Ser. No. 60/432,302 filed Dec. 10, 2002, which is incorporated herein by reference.

The present invention relates generally to integrated power conversion circuits using a half bridge, and particularly, to integrated power-transistors for a down-converter power supply having improved switching characteristics.

Power-converters are often used in power supplies, power amplifiers and motor drives. Down converters, including Buck converters are often used to convert an input voltage to a lower voltage for supplying power to a load, such as a microprocessor. These microprocessors have applicability in personal computers (PC) as well as other electronic devices. In PC applications, the input voltage to the converter is on the order of 12 V, and the required output is on the order of approximately 1.4 V, or a factor of about ten in step-down. Moreover, the required output currents of these converters are increasing to above 50 A, further adding to the design considerations of these circuits, and their devices.

Down-converter circuits often include a control transistor and a synchronous rectifier. These devices are often metal-oxide-semiconductor (MOS) transistors, which are silicon-based field effect transistors (FET). The use of a control FET (CF) and a synchronous rectifier FET (SF) has certain advantages. However, in known circuits these devices are discrete elements or are disposed in modules. Such circuits have certain drawbacks. For example, as the demand for faster switching frequencies increases, parasitic effects in such devices can have a deleterious impact on the ability of the CF and SF to meet these demands.

The losses associated with the on-and-off switching of down converters are beneficially minimized as much as possible. This has certain benefits, such as improving the battery life within the PC and reduction of the heat-dissipation. Conversion loss in MOSFET's is determined partly by resistance and partly by the figure of merit of the device, which is proportional to the on resistance, $R_{on}$ and the gate-to-drain charge, $Q_{gd}$.

In accordance with an exemplary embodiment of the present invention, a down converter comprises an integrated circuit having a control FET (CF) and a synchronous rectifier FET (SF), wherein the control FET is a lateral double-diffused (LDMOS) FET, and the conductivity-type of the LDMOS FET and the conductivity-type of the substrate are the same.

As will become clearer as the present description continues, the on-resistance and the gate-to-rain charge are improved via exemplary embodiments described herein. Other benefits of the embodiments are reduced parasitics, an option for integration of interface circuitry (for better control of the power-device switching) and a reduced production cost.

The invention is best understood from the following detailed description when read with the accompanying drawing figures. It is emphasized that the various features are not necessarily drawn to scale. In fact, the dimensions may be arbitrarily increased or decreased for clarity of discussion.

In the following detailed description, for purposes of explanation and not limitation, exemplary embodiments disclosing specific details are set forth in order to provide a thorough understanding of the present invention. However, it will be apparent to one having ordinary skill in the art having had the benefit of the present disclosure, that the present invention may be practiced in other embodiments that depart from the specific details disclosed herein. Moreover, descriptions of well-known devices, methods and materials may be omitted so as to not obscure the description of the present invention.

Figure 1:
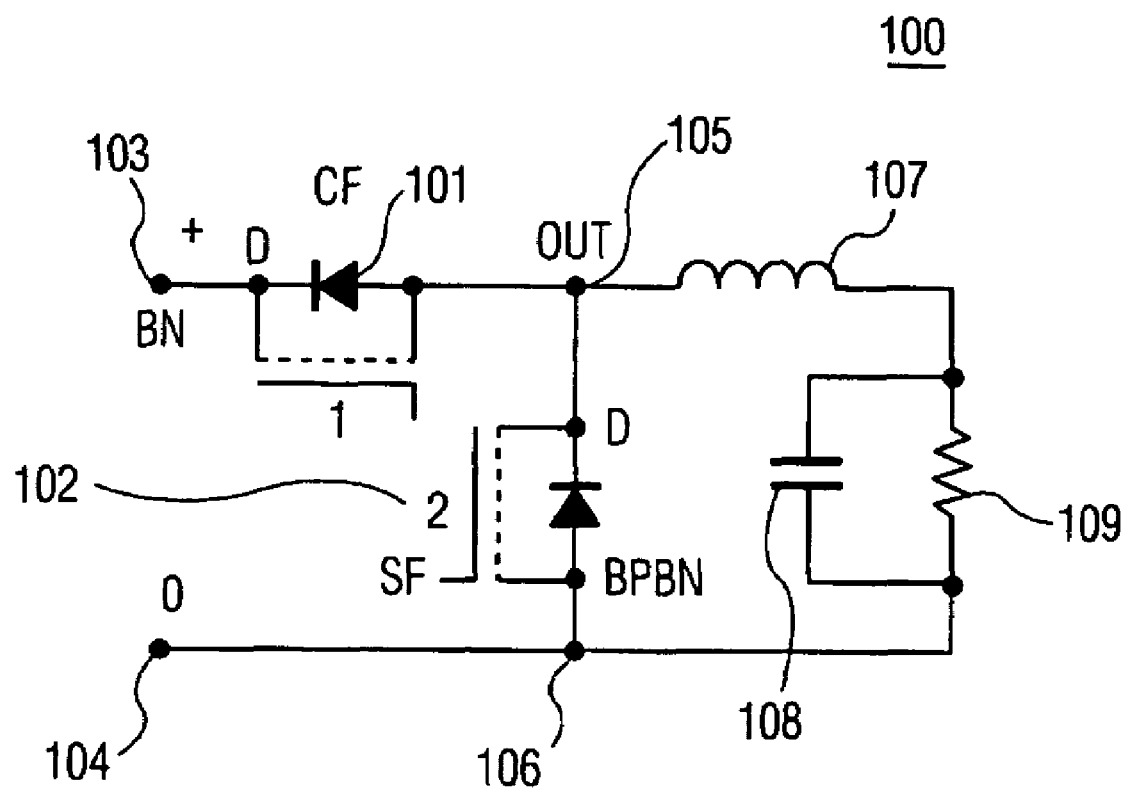
FIG. 1 is a schematic diagram of a down converter in accordance with an exemplary embodiment of the present invention.

FIG. 1 shows a down converter circuit 100 in accordance with an exemplary embodiment of the present invention. The circuit 100 is illustratively a Buck-converter circuit with a CF 101 and an SF 102. The input voltage, which is illustratively on the order of approximately 12V, is from a voltage source or power supply (not shown), and is applied over input terminals 103 and 104. The output terminals 105 and 106 are connected to an inductor 107, and ground, respectively. The load is a large storage capacitor 108 and a resistor 109. The resistor 109 represents one of a variety of electronic devices connected to the down-converter 100. For example, the resistor 109 may be a microprocessor. It is noted, however, that the use of the down converter circuit 100 of the exemplary embodiment is not limited to a microprocessor-based applications. For example, the converter-circuit may be used in switch-mode (audio) amplifiers. Still other applications of the converter circuit 100 will become apparent to one skilled in the art having had the benefit of the present disclosure.

Generally, the requirements on down converters such as circuit 100 are to provide an increasingly lower output voltage at the load, while providing an increasing current to the load. These requirements are coupled with a requirement for very low-ohmic switches. Furthermore, a reduction of the physical sizes and values of the inductor 107 and of the capacitor 108 (typically on the order of several mF) is desired in compact high-speed down-converter applications (e.g., on the order of approximately 300 kHz to approximately 2 MHz, with transients on the order of nano-seconds), and requires faster on/off switching-time of current to the load. Notwithstanding the need for efficient and rapid supply of the power to the load, the down converter circuit 100 usefully has reduced electronic parasitics.

As is known, in efficient high-speed power devices and circuits, the greatest sources of parasitic effects are parasitic resistance and inductance, which deteriorates the efficiency and switching speed of a device. Therefore, it is useful to reduce all parasitics (resistive and inductive) in the total switching path (e.g., the transistor, the transmission lines, the packaging, etc.) As will become clearer as the present description proceeds, these parasitics are reduced via integrated circuits of exemplary embodiments described herein.

The exemplary embodiments include integration of the CF 101 and the SF 102 in a semiconductor device structure (chip) that reduces the undesirable electronic parasitics by various methods and structures. Moreover, these embodiments foster the fabrication of the CF 101 and SF 102 in an integrated package or directly on the circuit board of the load (e.g., PC-board in a microprocessor application) using a minimum number of processing steps, so the overall cost of the device is comparatively reduced through a reduction in processing complexity. Finally, in addition to reducing the parasitic resistance and inductance through transistor choice and design, the exemplary embodiments reduce the spacing between the transistors to realize a reduction in the parasitics.

Figure 2A:
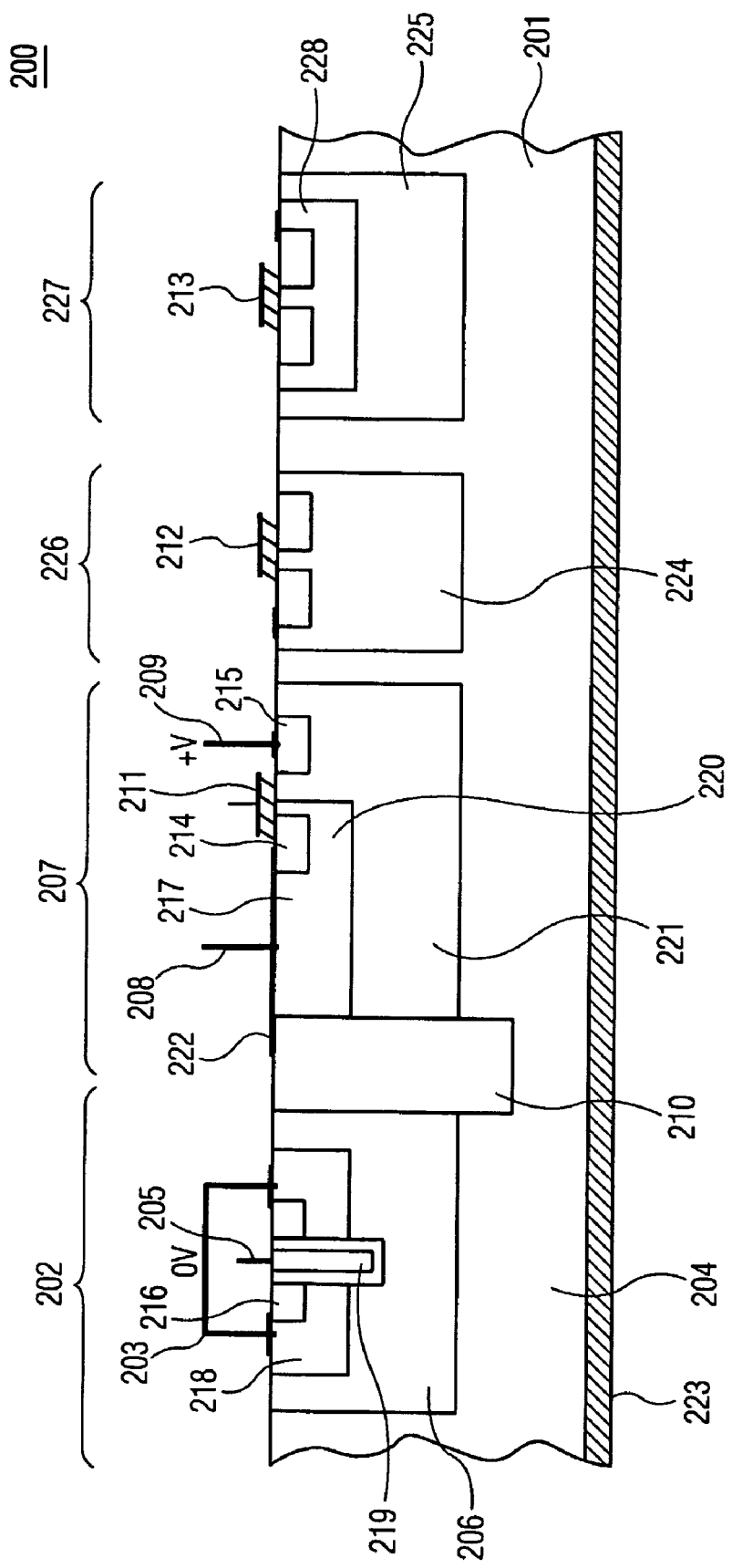
FIG. 2a is a cross-sectional view of the integrated CF and SF used in a down converter in accordance with an exemplary embodiment of the present invention.

FIG. 2a shows an integrated circuit (IC) 200 in accordance with an exemplary embodiment of the present invention. It is noted that the various materials and doping polarities are intended to be illustrative of the exemplary embodiments. Clearly, other materials, elements and doping polarities may be used to realize the exemplary embodiments. Moreover, it is noted that known materials and semiconductor processing techniques may be used to realize the IC 200. As such, in the interest of brevity and clarity of the description of the exemplary embodiments, these known materials and techniques are generally omitted.

The IC 200 is illustratively a half-bridge circuit and includes devices fabricated on a common n+ substrate 201, which is illustratively n-doped silicon. A vertical double-diffused MOS (VDMOS) transistor 202 includes a gate 219 having a gate contact 205, a drain contact 223, an n+ source 216 and a p-body 218 shorted to the source 216 via source contact 203. The VDMOS is formed in an n-doped epitaxial (epi) well 206. The drain of the VDMOS structure is comprised of a heavily doped (n+) drain 204 and the n-epi well 206. Hereinafter the VDMOS drain will be referred to as drain 204.

In the present exemplary embodiment, the VDMOS transistor 202 is configured to function as the SF rectifier 102 of the down converter circuit 100 as will become clearer as the present description continues. Beneficially, the VDMOS FET 202 is a trench-gate structure, which generally provides a lower on-state resistance (for example, on the order of 10 mOhm*mm$^2$ for a device with an operating voltage of approximately 25 V) compared to other FET devices.

An LDMOS transistor 207 is formed in a buried p-well 221, and includes a gate 211; an n+ source 214 shorted to a p-body 217; and an n– drain 215, which is formed in an n-type well 220. The gate contacts 205 and 211 are each connected to a control section (not shown) that drives the gates 219 and 211 for switching the FET's 202 and 207 on and off. In the exemplary embodiment, the LDMOS FET functions as the CF of the down-converter circuit 100.

The IC 200 may also include an NMOS FET 226 and a PMOS FET 227, which may be used in various applications of the IC. The FET's may be used in conjunction with interface circuitry (not shown) for better control of the switching, and a reduced inductance in the gate-drive circuit. These and other devices may also be incorporated on the IC in keeping with the exemplary embodiments.

Illustratively, gate 219 is driven between ground and approximately 5V to approximately 12 V. Gate 211 is driven between the gate voltage and source voltage of the LDMOS FET 207. The source contact 208 connects the source 214 to the output 208 and the drain 204, which cycles between input-voltage (approximately 12V) and a flyback-voltage (typically about –0.2V). Hence, the gate 211 is driven by a control block supplied by an external capacitor, which is illustratively charged by a bootstrap circuit and/or a charge-pump circuit (not shown).

As mentioned above, it is useful to provide circuit 100 including the power transistors (FET'S) with a reduced parasitic inductance and on-resistance compared to known devices. Illustratively, by virtue of the IC 200, the parasitic inductance of the circuit 100 including the half-bridge IC 200 of an exemplary embodiment is on the order of approximately 1.0 nH, while the on-resistance is on the order of approximately 5 mOhms to approximately 10 mOhms. The reduced parasitic inductance results in an improved switching speed (on/off time) for the load (e.g., capacitor 108 and resistor 109), while the reduced on-resistance results in a reduction of the conductive losses of the IC.

The semiconductor device structure and design of the IC 200 realizes benefits in reduced parasitics in part because of the reduced parasitics of the devices that comprise the IC 200. For purposes of illustration, the VDMOS FET 202 provides a relatively low on-state resistance, illustratively on the order 10 mOhm*mm$^2$ for a 25V device and a reasonable $Q_{gd}$. The LDMOS FET 207 also provides a reasonable low on-resistance (illustratively 25 mOhm*mm$^2$ for a 25V device), and a low $Q_{gd}$; the product (Ron*Qgd) is illustratively on the order of approximately 12 mOhm*nC for LDMOS FET 207. Of course this is merely illustrative, and other similar improved values may be realized via the exemplary embodiments depending on the application.

Figure 2B:
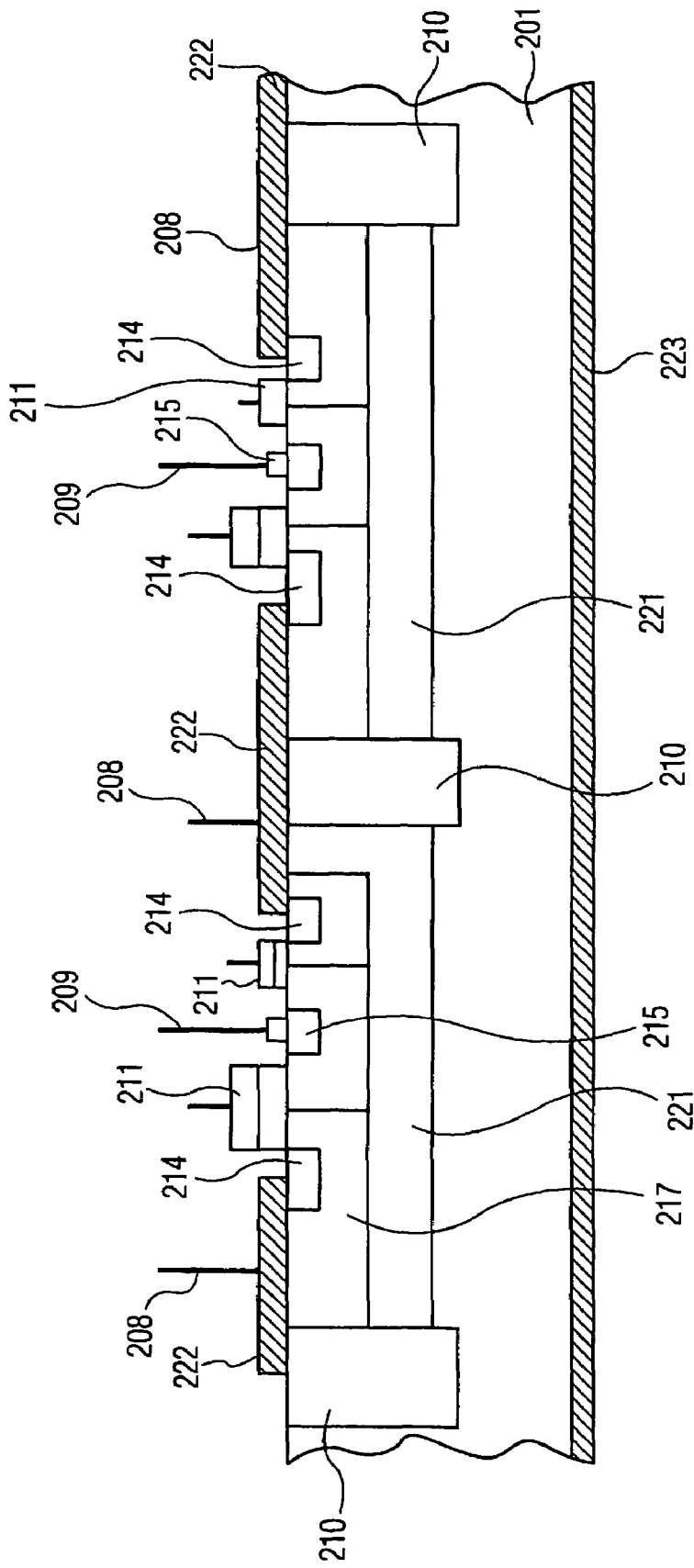
FIG. 2b is a cross-sectional view showing a plurality of conductive plugs inside the cells (source/drain fingers) of a CF-switch of a down-converter in accordance with an exemplary embodiment of the present invention.

In the exemplary embodiment shown in FIG. 2a, the drain contact 209 is connected to the voltage input of the down-converter circuit 100 (e.g., 12V as mentioned above), while the source contact 208 is connected to the drain contact 223 of the VDMOS FET, which is also the drain of the SF 102 in the present exemplary embodiment The source contact 208 is illustratively connected via a deep connection such as a conductive n+ plug 210 (or heavily doped sinker) in the substrate 201. Alternatively, an n+ plug 210 may be disposed in an etched trench or dip; or a metal short (or via) may be disposed in an etched trench to achieve this end. In any event, this provides a low-Ohmic connection with a small lateral dimension. The conductive plug 210 or similar device then is applied on multiple locations inside a cell of LDMOS devices, (e.g., as shown in FIG. 2b) thus connecting source-contact 208 with low resistance to heavily doped drain 204, using contact 222 with a relatively thin first metal only, which allows fine patterns inside the cell. This is advantageous for allowing a thick (second) power-metal for 203 and 209 on the top-side of the IC with coarse patterns and a thick power-metal (drain contact 223) for the output at the bottom-side (i.e., beneath the substrate).

As can be appreciated, the source contact 208 of the LDMOS FET 202 and the drain contact 223 of the VDMOS FET 207 have now a low-ohmic connection on the chip (IC) and are connected to an inductor of a down converter, such as inductor 107 of FIG. 1. Beneficially, this fosters a reduction in parasitics compared with other structures. Finally, other connections are made in a relatively straightforward manner, so the IC 200 is connected to the other elements of the down converter circuit 100.

The IC 200 is fabricated illustratively as follows, using well-known semiconductor processing techniques. An n+ silicon layer forms the substrate 201, with n– epitaxy approximately 3-4 um in thickness forming the n– well 206. This epi-layer is about 2-3 um in thickness at end of processing. This step is followed first by a P-well implantation and diffusion to form the p-well 221 and p-wells 224 and 225 of the NMOS and PMOS FET's 226 and 227, respectively. An N-well implantation is carried out to form the n-wells 220 of the LDMOS drift-region and the PMOS FET n-well 228. This is followed by a dopant diffusion. A deep n+ plug 210 may then be implanted if desired, followed by a diffusion. Thereafter a trench is etched for the VDMOS FET 202.

Alternatively, the deep N-type plug 210 could be fabricated using the trench with additional n+ implant in its bottom for a surface contact to the n+ wafer to form the drain contact 204. Next an optional field-oxide step is carried out via local oxidation of silicon (LOCOS). This field-oxide (not shown) also may be grown, or deposited and etched. Thereafter, a gate-oxide formation (e.g., by oxide growth) step is carried out to form the gate oxides of the VDMOS FET 202 and LDMOS FET 207. These gate oxides have a thickness of approximately 15 to approximately 40 nm, depending on the required gate-source voltage (Vgs), which is illustratively approximately 5V to approximately 12V.

Thereafter, a poly-silicon deposition and n+ doping is carried out, which is followed by patterning of the poly. After the poly-deposition sequence is complete, a shallow p-type DMOS body-implantation is effected to form the body 218 (e.g., with Latid-Boron, with Arsenic link). Next, a (oxide) spacer (not shown) is formed by standard processing techniques. This processing sequence results a short-channel and a good link to the source, which fosters a low-$R_{on}$ for the LDMOS FET 207. Next, a shallow n+ region, and a shallow p+ region are implanted and activated, followed by field-oxide (FOX) deposition, contact-windows (not shown), first metal, oxide or nitride-deposition, vias (not shown), thick second metal (not shown) with a seed-layer and galvanic copper 10-15 um, covered by protection and opened to bond-pads (not shown).

In operation, if the LDMOS FET 207 (CF) is on, it charges the n+ substrate to the input voltage (e.g., 12V), thereby providing a current in the load-inductance 107. If CF is closed, the load-inductance 107 pulls the n+ substrate from 12V towards approximately −0.1V or to approximately −0.7V, depending on the turn-on timing of the VDMOS FET 202. The current in a down-converter normally flows through the load-inductance 107 from the source 214 and to the load. Hence, the potential on n+ substrate will not be above +12V; the potential on 209 may rise above this value, depending on the inductance. Finally, it is noted that in embodiments described herein, the inductance may be reduced further using surface solder-bumps and flip-chip packaging.

Figure 3:
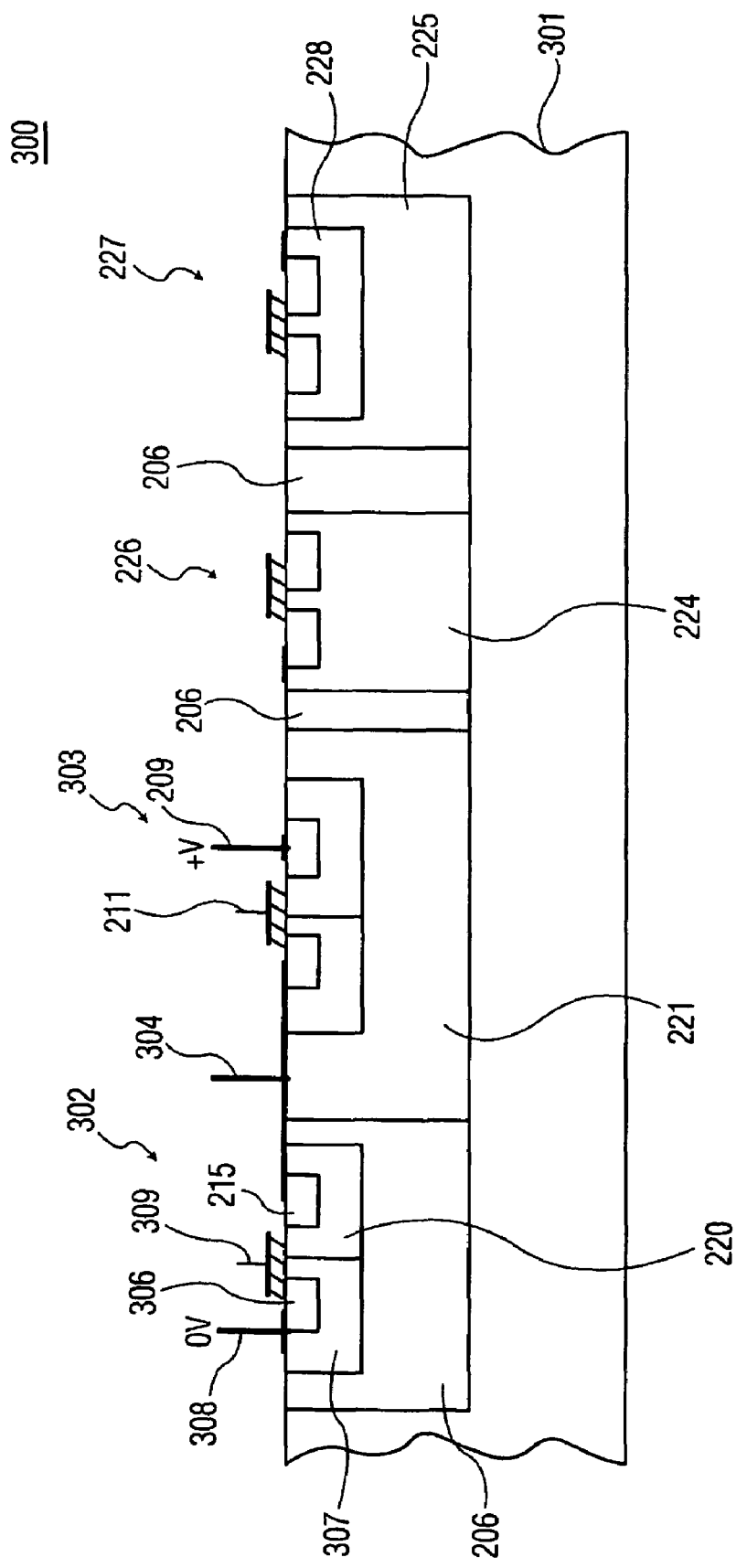
FIG. 3 is a cross-sectional view of the integrated CF and SF used in a down converter in accordance with an exemplary embodiment of the present invention.

FIG. 3 shows an IC 300 in accordance with another exemplary embodiment of the present invention. This IC 300 shares common features and materials with the IC 200 previously described. As such, differences will be highlighted, and commonalities not discussed. The IC 300 illustratively includes an n-type substrate 301 with two LDMOS FET's 302 and 303, respectively. The LDMOS FET 302 is usefully the SF 102 of FIG. 1, while the LDMOS FET 303 is the CF 101. The LDMOS FET 303 is substantially identical to that described in FIG. 2a. One difference lies in its source connection, which is via metallization connected to the drain contact 304 of the LDMOS FET 302. This corresponds, of course, to the output 105 of FIG. 1.

The LDMOS FET 302, which functions as the SF 102, has a source 306 and body 307 connected to ground via a source contact 308. The gate 309 is connected to a control function (not shown) much like the control function of the gate 211 described above. The drain 215 is placed in an n-well 220 and connected to output 304 via 305. The device is placed in an n-epi well 206. Advantageously, the IC 300 has a low on resistance, with each LDMOS transistor having an on-resistance ($R_{on}$) per unit area on the order of approximately 10 mΩ*mm$^2$ for a 20V. Moreover, all power connections to the IC are now on a common side of the chip, eliminating the need for the formation of backside contacts or the deep conductive plug(s) or similar device. This illustrative embodiment is also beneficial because the substrate does not need to be thinned during processing to reduce parasitic resistance, or to have a very low resistivity via super-doping. This embodiment however puts higher demands to the metallization of both LDMOS-devices, and may require an additional (third) metal-layer and via-pattern.

Figure 4:
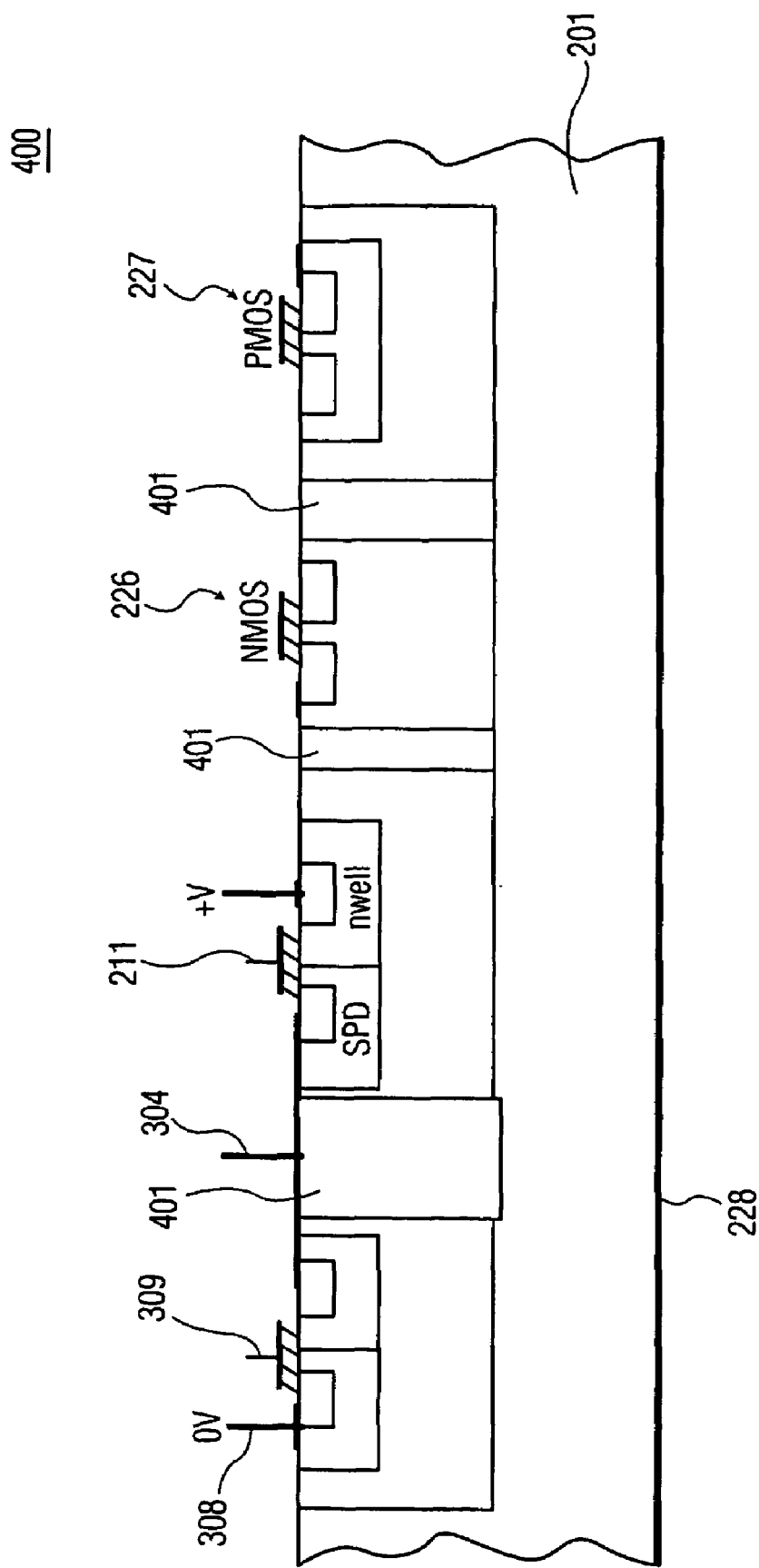
FIG. 4 is a cross-sectional view of the integrated CF and SF used in a down converter in accordance with an exemplary embodiment of the present invention.

FIG. 4 shows another exemplary embodiment of the present invention. This embodiment shares common features and structures with that of FIGS. 2a, 2b and 3, and may be used in a circuit such as is shown in FIG. 1. The IC 400 of FIG. 4 is essentially IC 300 with n+ plugs 401 (diffused, pre-etched or trench) and the n+ substrate 201 with output 105 of the circuit of FIG. 1 at the bottom-side via metallization 223. Plugs 401 are useful to relieve the demand on the metallization of both LDMOS FETs and allow for a two-layer metal-system, which is advantageous during fabrication.

Figure 5:
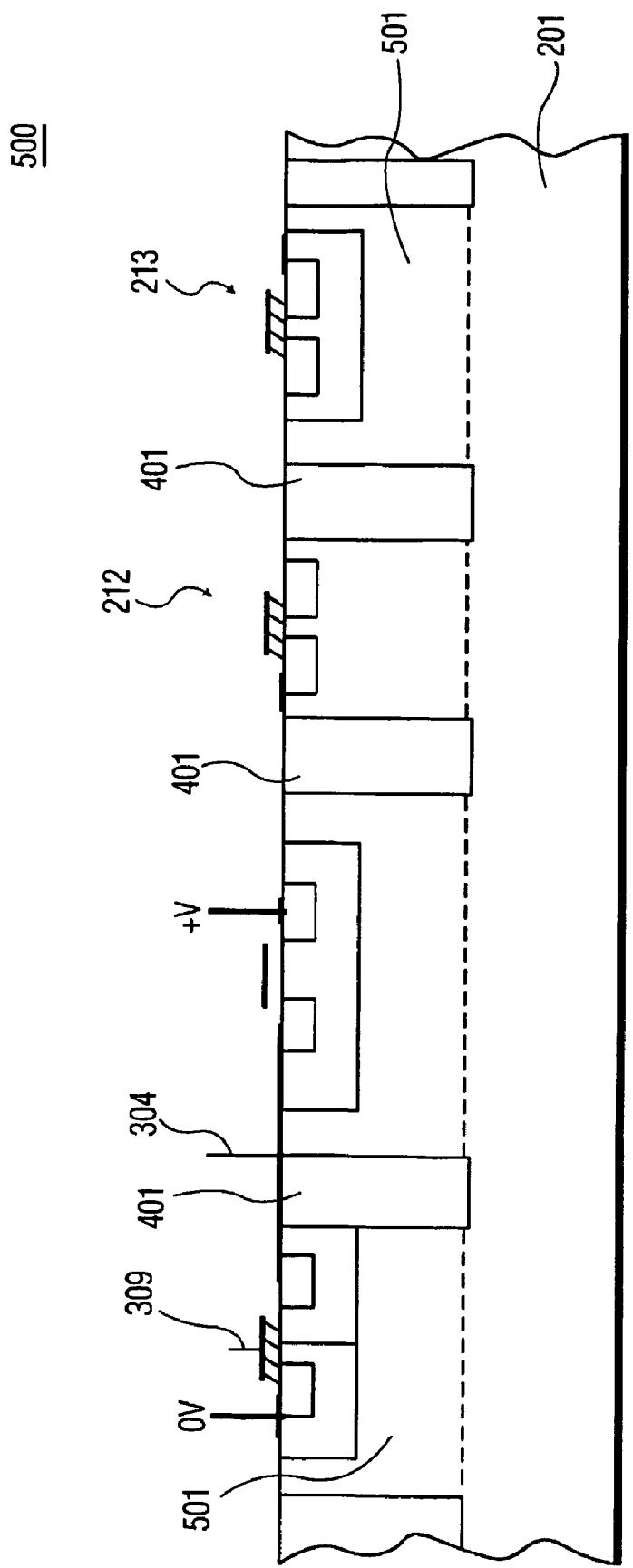
FIG. 5 is a cross-sectional view of the integrated CF and SF used in a down converter in accordance with an exemplary embodiment of the present invention.

FIG. 5 is another exemplary embodiment of the present invention. Again, the IC 500 shares common features and structures with the exemplary embodiments of FIGS. 2-4. To wit, IC 500 is essentially IC 400 except a from p-epitaxial layer 501 is disposed on the n+ substrate 201; or may be an n-epi layer on the n+ substrate 202 with a blanket P-well implantation and diffusion. Here device 309 is placed in a p-well 501. The plugs 401 also act for well-isolation in this embodiment. This saves at least one mask-step.

The invention being thus described, it would be obvious that the same may be varied in many ways by one of ordinary skill in the art having had the benefit of the present disclosure. Such variations are not regarded as a departure from the spirit and scope of the invention, and such modifications as would be obvious to one skilled in the art are intended to be included within the scope of the following claims and their legal equivalents.

The invention claimed is:

1. A down converter, comprising:
   an integrated circuit having a control Field Effect Transistor (FET) (CF) disposed in a first well having a first polarity; and
   a synchronous rectifier FET (SF) having a source region and a channel region both disposed in a second well having a second polarity opposite the first polarity,
   wherein the control FET is a Lateral Double-Diffused Metal Oxide Semiconductor (LDMOS) type and the SF is a vertical Metal Oxide Semiconductor type; the first and second wells are formed in contact with a heavily doped region of a substrate; and a conductivity- type of the LDMOS FET and a conductivity-type of the heavily doped region of the substrate are of the same type;
   wherein at least a portion of the heavily doped region forms a drain region for the SF; and a source contact of the CF is connected to drain region of the SF via a conductive plug in the substrate.

2. A down converter as recited in claim 1, wherein the synchronous rectifier FET is a Vertical Double-Diffused Metal Oxide Semiconductor (VDMOS) FET.

3. A down converter as recited in claim 1, wherein the synchronous rectifier FET is a vertical trench DMOS FET.

4. A down converter as recited in claim 1, wherein the integrated circuit does not include isolation regions between the CF and the SF.

5. A down converter as recited in claim 1, wherein the conductivity type of the heavily doped region is n-type.

6. A down converter as recited in claim 1, wherein the integrated circuit further includes one or more additional FETs configured to control gate switching of the control FET and the synchronous rectifier FET.

7. A down converter as recited in claim 1 further comprising an inductor, wherein the source contact of the control FET and a drain contact of the synchronous rectifier FET are connected to the inductor of the down converter.

8. A down converter as recited in claim 1 further comprising an inductor, wherein the source contact of the control FET and a drain contact of the synchronous rectifier FET are connected to the inductor of the down converter, the conductive plug forms a low-ohmic connection to mitigate resistive and inductive parasitics of the integrated circuit.

9. A down converter as recited in claim 8, wherein the integrated circuit has a parasitic inductance on the order of 1 nH or less.

10. A down converter as recited in claim 1 further including a voltage input, wherein the control FET has a drain contact connected to the voltage input of the down converter.

11. A down converter as recited in claim 10, wherein the source contact of the control FET is connected to the drain contact of the synchronous rectifier FET via the conductive plug and a portion of the heavily doped region in the substrate.

12. A down converter as recited in claim 1 wherein the control FET includes a gate driven by a control block supplied by an external capacitor.

* * * * *